United States Patent
Spielman et al.

(10) Patent No.: US 6,842,410 B1
(45) Date of Patent: Jan. 11, 2005

(54) DIGITAL AUTOMATIC GAIN CONTROL OF A MULTILEVEL OPTICAL DISC READ SIGNAL

(75) Inventors: Steven R. Spielman, Oakland, CA (US); Yung-Cheng Lo, San Leandro, CA (US); David C. Lee, Alameda, CA (US); Judith C. Powelson, Alameda, CA (US)

(73) Assignee: LSI Logic Corporation, Milpitas, CA (US)

( * ) Notice: Subject to any disclaimer, the term of this patent is extended or adjusted under 35 U.S.C. 154(b) by 730 days.

(21) Appl. No.: 09/828,311

(22) Filed: Apr. 6, 2001

Related U.S. Application Data

(63) Continuation-in-part of application No. 09/253,808, filed on Feb. 18, 1999, now Pat. No. 6,275,458.

(51) Int. Cl.[7] ............................................. G11B 5/09
(52) U.S. Cl. ............................. 369/47.27; 369/53.31; 369/124.07; 369/275.3
(58) Field of Search .......................... 369/47.25, 47.26, 369/47.27, 53.31, 59.15, 59.25, 59.26, 124.07, 124.1, 275.3

(56) References Cited

U.S. PATENT DOCUMENTS

| | | | |
|---|---|---|---|
| 4,408,189 A | 10/1983 | Betts et al. | |
| 4,888,779 A | 12/1989 | Karabed et al. | |
| 5,257,272 A | 10/1993 | Fredrickson | |
| 5,331,320 A | 7/1994 | Cideciyan et al. | |
| 5,375,249 A | 12/1994 | Cho | |
| 5,497,384 A | 3/1996 | Fredrickson et al. | |
| 5,537,382 A | 7/1996 | McLaughlin et al. | |
| 5,748,119 A | 5/1998 | Ko | |
| 5,760,983 A | * 6/1998 | Cowen | ........................ 360/48 |
| 5,781,130 A | 7/1998 | McLaughlin et al. | |
| 5,790,571 A | 8/1998 | Varanasi | |
| 5,818,806 A | 10/1998 | Wong et al. | |
| 5,828,754 A | 10/1998 | Hogan | |
| 5,854,779 A | 12/1998 | Johnson et al. | |
| 6,023,234 A | 2/2000 | Fukuoka | |

OTHER PUBLICATIONS

"Magnetoresistive Heads and Partial Response Maximum Likelihood Read Channels Technology Overview", http://www.andatco.com/genesis_s/segment1/techinfo/white_papers/mrhead/mrhead.html, Feb. 3, 1999.

Taratorin, Alex, "Charactereization of Magnetic Recording Systems: A Practical Approach", Chapter 9, "Introduction to PRML", http://www.guzik.com/Chapter9.htm, Feb. 3, 1999.

* cited by examiner

*Primary Examiner*—Paul W. Huber
(74) *Attorney, Agent, or Firm*—Christopher P. Maiorana

(57) ABSTRACT

A system and method are disclosed for providing a gain control signal for a multilevel read signal. In one embodiment, maximum automatic gain control marks are periodically inserted amongst a series of data fields. The automatic gain control marks include a series of high level marks such that the maximum signal detected in the interior portion of each maximum automatic gain control mark is not reduced by intersymbol interference. Minimum automatic gain control marks are also periodically inserted amongst a series of data fields. The automatic gain control marks include a series of high level marks such that the maximum signal detected in the interior portion of each minimum automatic gain control mark is not reduced by intersymbol interference. In another embodiment, multilevel signals are encoded to facilitate automatic gain control. The effect of a plurality of candidate merge symbols on the residual running total power associated with a current data block is determined. A preferred merge symbol is selected based on a residual running total power minimization criteria. The preferred merge symbol is added to the current data block.

12 Claims, 9 Drawing Sheets

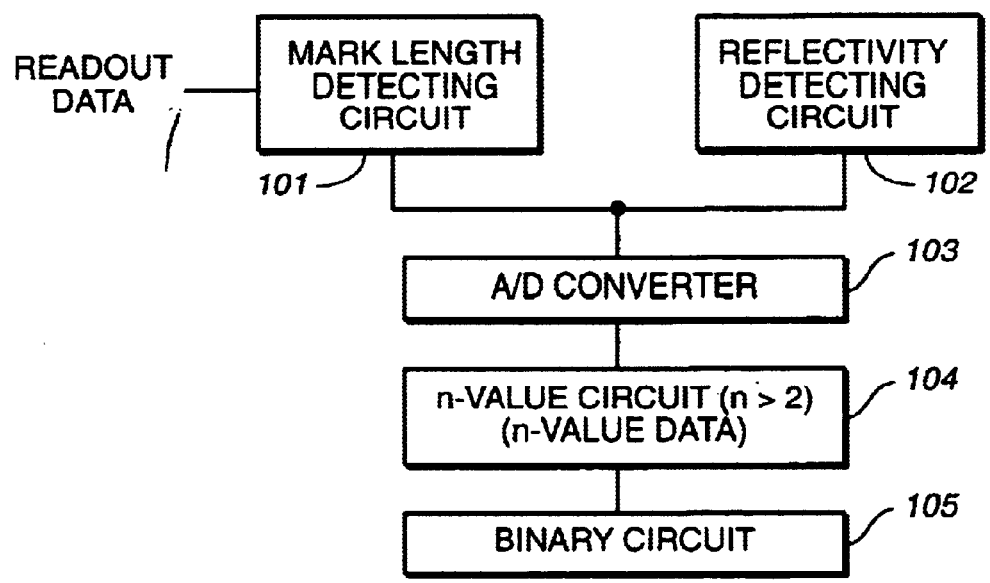
FIG._1

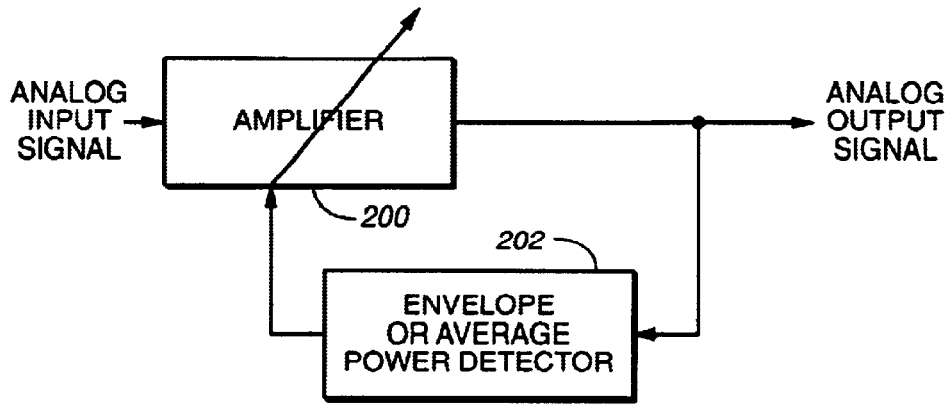
FIG._2A
*(PRIOR ART)*
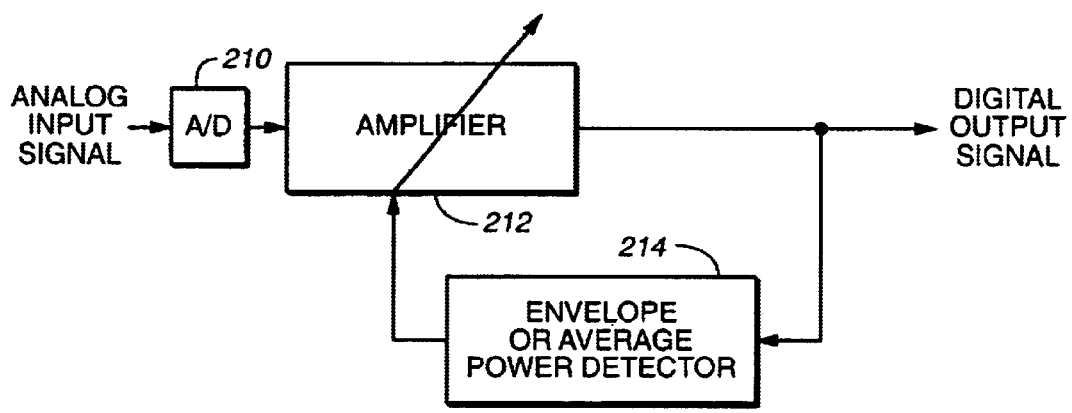
FIG._2B
*(PRIOR ART)*
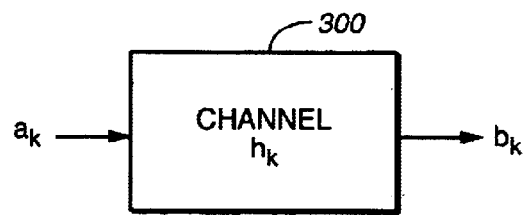
FIG._3

[ DATA FIELD ][ AGC FIELD ][ DATA FIELD ][ AGC FIELD ] . . .
*FIG._4A*
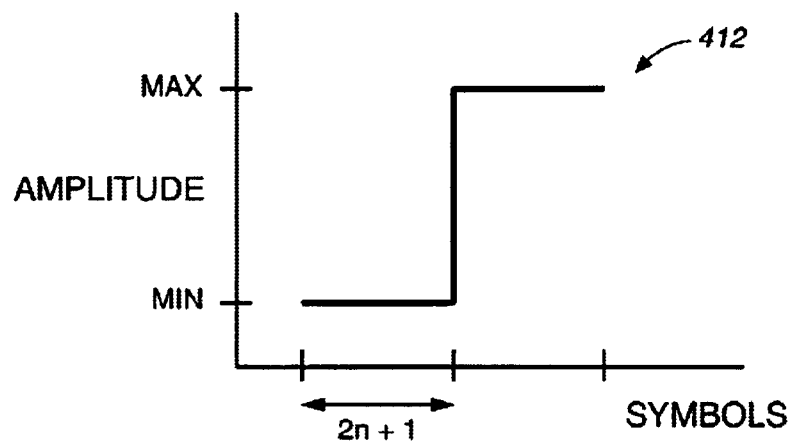
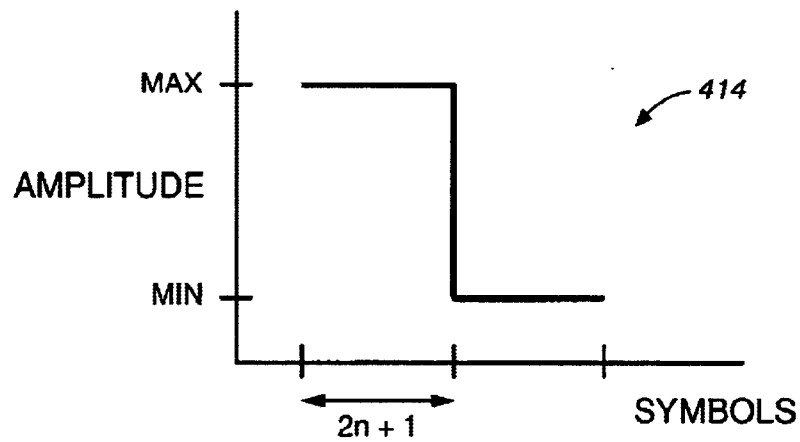
*FIG._4B*

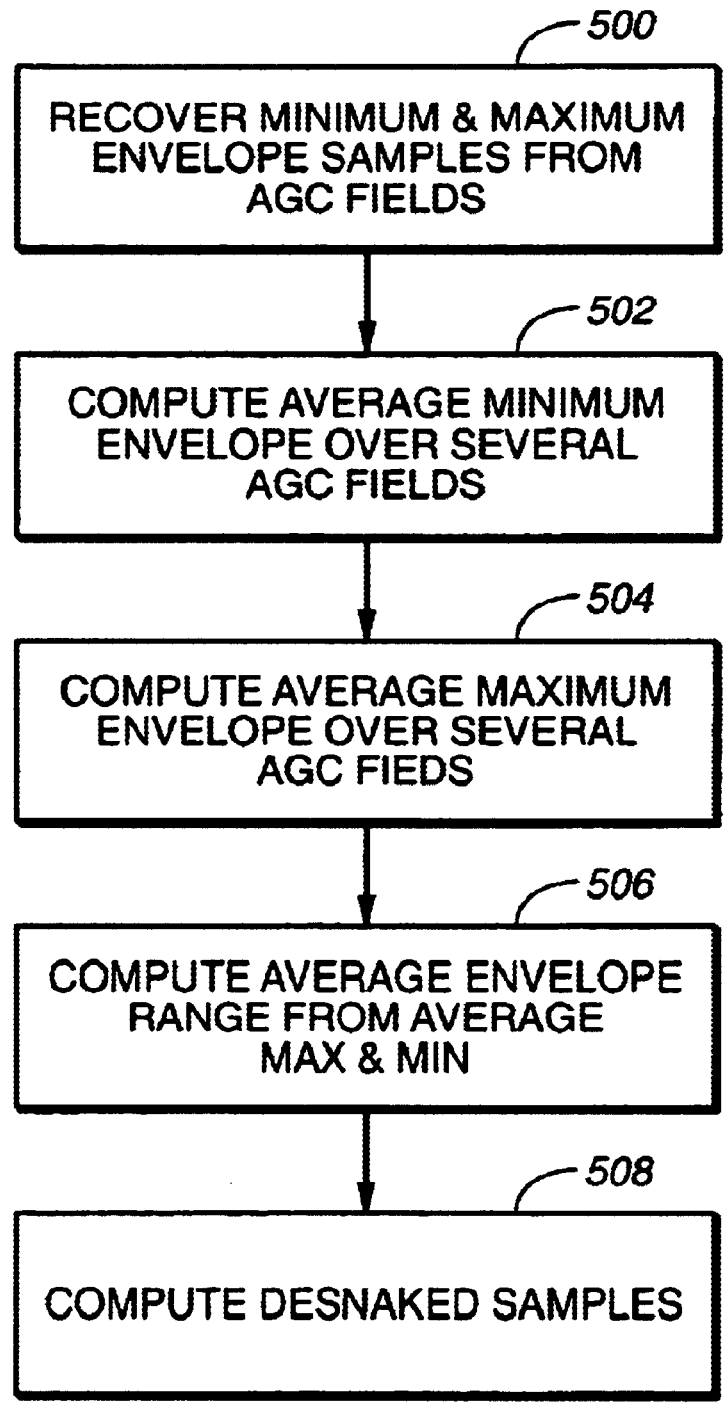
FIG._5

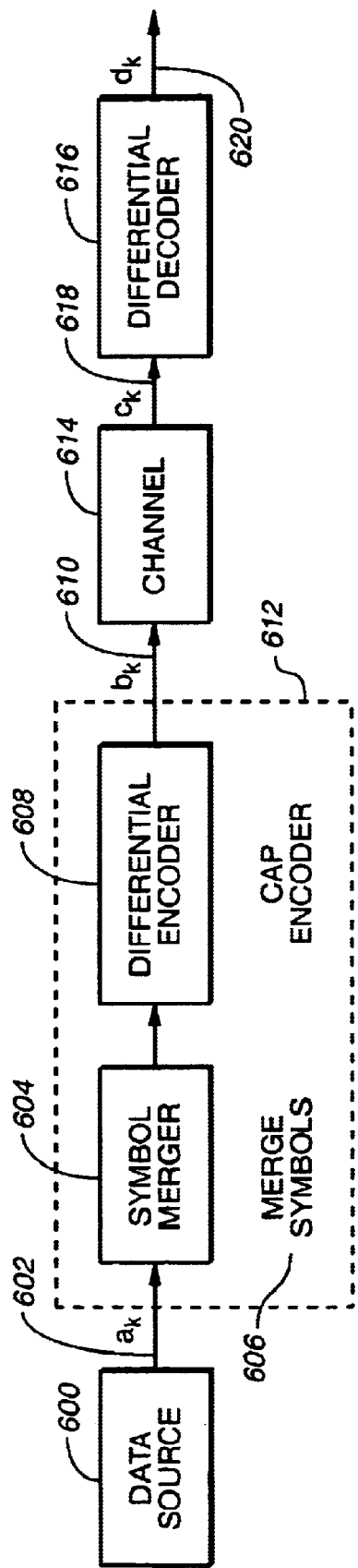
FIG._6A
[ CAP FIELD ][ DATA FIELD ][ CAP FIELD ][ DATA FIELD ] . . .
| — | N — | — | N — |
LENGTH:
(SYMBOLS)
FIG._6B

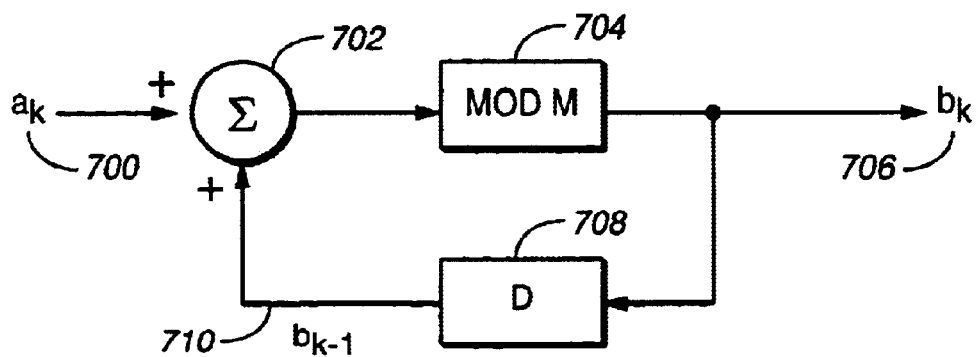
FIG._7A
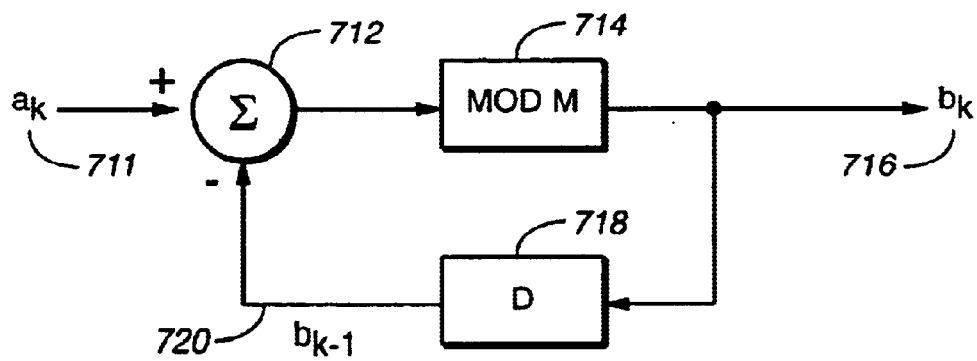
FIG._7B

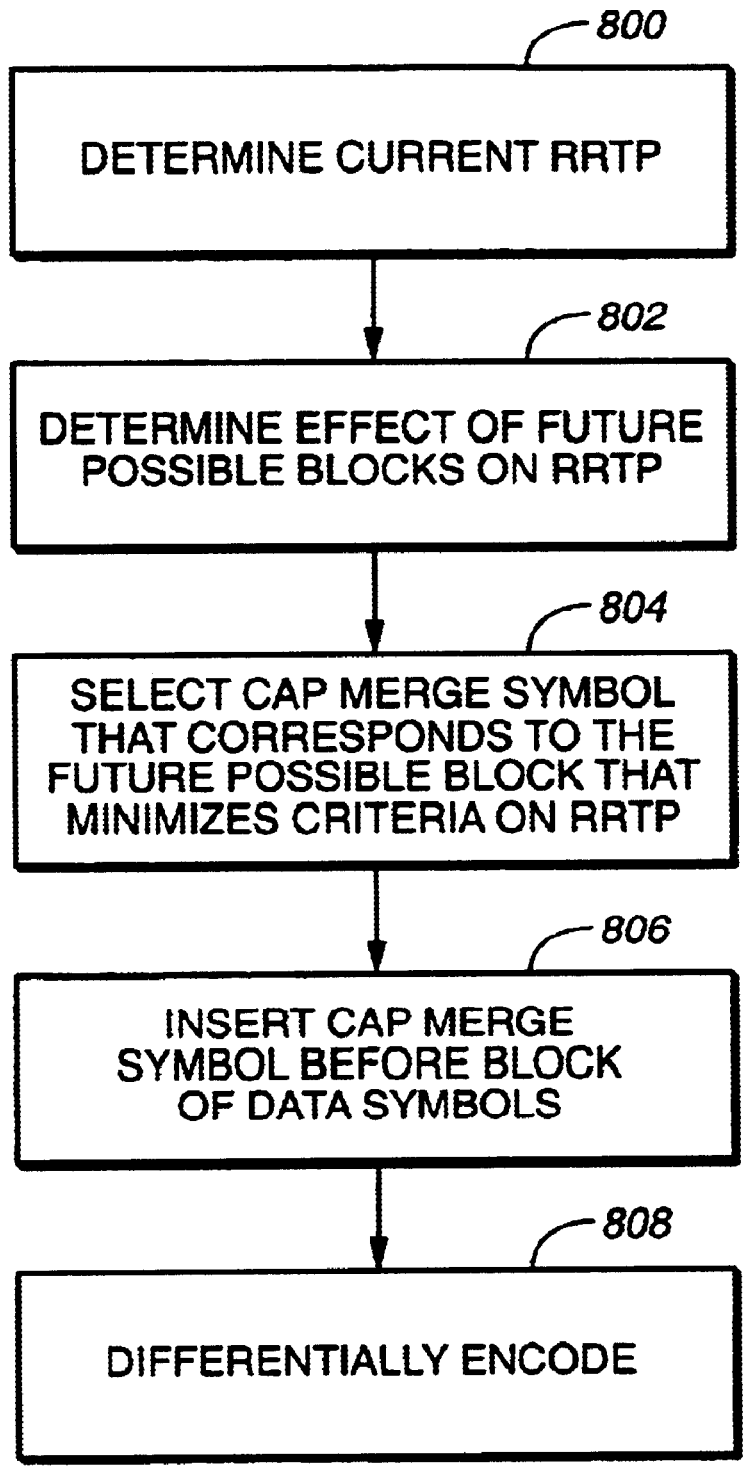
FIG._8A

NO. OF LEVELS        M : 4
PREVIOUS OUTPUT LEVEL : 0
INPUT BLOCK          : 0  1  3  2
CURRENT RRTP         : -2

CANDIDATE MERGE SYMBOL  0

| | | | | | |
|---|---|---|---|---|---|
| $a_k$ |   | 0 | 0 | 1 | 3 | 2 |
| $b_k$ | 0 | 0 | 0 | 1 | 0 | 2 |
| DV ($b_k$) |   | -3 | -3 | -1 | -3 | +1 |
| DSS ($b_k$) |   | 9 | 9 | 1 | 9 | 1 |
| RRTP | -2 | +2 | +6 | +2 | +6 | +2 |

→ ENDING / RRTP / = 6
   MAX / RRTP / = 6

CANDIDATE MERGE SYMBOL  1

| | | | | | |
|---|---|---|---|---|---|
| $a_k$ |   | 1 | 0 | 1 | 3 | 2 |
| $b_k$ | 0 | 1 | 1 | 2 | 1 | 3 |
| DV ($b_k$) |   | -1 | -1 | +1 | -1 | +3 |
| DSS ($b_k$) |   | 1 | 1 | 1 | 1 | 9 |
| RRTP | -2 | -6 | -10 | -14 | -18 | -14 |

→ ENDING / RRTP / = 14
   MAX / RRTP / = 18

CANDIDATE MERGE SYMBOL  2

| | | | | | |
|---|---|---|---|---|---|
| $a_k$ |   | 2 | 0 | 1 | 3 | 2 |
| $b_k$ | 0 | 2 | 2 | 3 | 2 | 0 |
| DV ($b_k$) |   | +1 | +1 | +3 | +1 | -3 |
| DSS ($b_k$) |   | 1 | 1 | 9 | 1 | 9 |
| RRTP | -2 | -6 | -10 | -6 | -10 | -6 |

→ ENDING / RRTP / = 6
   MAX / RRTP / = 10

CANDIDATE MERGE SYMBOL  3

| | | | | | |
|---|---|---|---|---|---|
| $a_k$ |   | 3 | 0 | 1 | 3 | 2 |
| $b_k$ | 0 | 3 | 3 | 0 | 3 | 1 |
| DV ($b_k$) |   | +3 | +3 | -3 | +3 | -1 |
| DSS ($b_k$) |   | 9 | 9 | 9 | 9 | 1 |
| RRTP | -2 | +2 | +6 | +10 | +14 | +10 |

→ ENDING / RRTP / = 10
   MAX / RRTP / = 14

FIG._8B

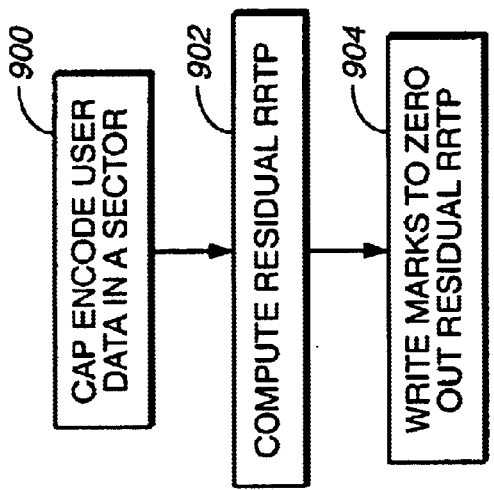
FIG._9A
FIG._9B
[ CAP FIELD ][ DATA FIELD ] ... [ CAP FIELD ][ DATA FIELD ][ SECTOR CLEANUP FIELD ]
[ CAP FIELD ][ DATA FIELD ]

DIGITAL AUTOMATIC GAIN CONTROL OF A MULTILEVEL OPTICAL DISC READ SIGNAL

CROSS REFERENCE TO RELATED APPLICATIONS

This application is a continuation in part of U.S. patent application Ser. No. 09/253,808 entitled METHOD AND APPARATUS FOR READING AND WRITING A MULTILEVEL SIGNAL FROM AN OPTICAL DISC filed Feb. 18, 1999, now U.S. Pat. No. 6,275,458 which is incorporated herein by reference for all purposes.

FIELD OF THE INVENTION

The present invention relates generally to a method for processing multilevel signals read from an optical disc. More specifically, a method of detecting envelope fluctuations and removing such distortions in the presence of noise and defects using digital signal processing techniques is disclosed.

BACKGROUND OF THE INVENTION

The following acronyms are defined in this specification:

A/D analog-to-digital
AGC automatic gain control circuit
constant average power
CD compact-disc data-storage drives.
DCC DC control
DML differential multilevel
DV digital value
DSS digital sum square
EFM eight-fourteen modulation
ISI intersymbol interference
PR1 partial-response class 1
RAP The running average power
RLL run-length limit
RRTP residual running total power
RTP running total power In order to increase the capacity and speed of optical data storage systems, multilevel optical recording systems have been developed. Note that in this specification, the term multilevel refers to more than two levels. In a traditional optical recording system, reflectivity of the recording medium is modulated between two states. The density of data recorded on an optical recording medium can be increased by modulating the reflectivity of the optical recording medium into more than two states. U.S. Pat. No. 5,144,615 entitled APPARATUS AND METHOD FOR RECORDING AND REPRODUCING MULTILEVEL INFORMATION issued to Kobayashi (hereinafter "Kobayashi") discloses a system for recovering multilevel data from an optical disc.

FIG. 1 is a block diagram illustrating the system disclosed in Kobayashi for recovering such data. Analog data read from a detector is input from a mark-length detection circuit 101 and a reflectivity detection circuit 102. The outputs of these circuits are sent to an analog-to-digital (A/D) converter 103. The A/D converter 103 includes an n-value circuit 104 which determines the value to which the signal corresponds by comparing the signal to predetermined reference voltages. Subsequently, the n-value signal is converted into a binary signal by binary circuit 105. While this system discloses the concept of reading a multilevel signal and converting it into a digital signal in a basic sense, no method is disclosed for handling various imperfections in a multilevel signal read from an optical disc that tend to occur in practice. Specifically, envelope fluctuations in the multilevel signal can significantly degrade the performance of subsequent detection circuits. These envelope fluctuations are a form of amplitude modulation of the signal caused by variations in the characteristics of the optical disc or in the drive mechanism that are separate from the multilevel modulation.

For example, variations in the index of refraction or the thickness of the polycarbonate material covering the surface of the disc cause distortions. Also, disc warpage may cause variations in both the recorded and readback signals because, as the disc spins, different portions of the disc come into and out of focus. Envelope fluctuations can be separated into two components: a common-mode component, or DC offset; and a differential-mode component. These envelope fluctuations are often called snaking of the signal, which alludes to the snake-like visual appearance of such a signal plotted over a long period of time. The process of removing such fluctuations, particularly the differential-mode component, is called desnaking.

Simple high-pass filtering, such as AC-coupling, can remove the common-mode component. An automatic gain control (AGC) circuit can desnake the differential-mode component of the signal. FIG. 2A is a block diagram of a typical analog AGC circuit for removing envelope fluctuations. The analog input signal enters a variable-gain amplifier 200. The amplifier output enters an analog envelope or average-power detector 202, which feeds back information on the current envelope or average-power level to control the variable-gain amplifier in order to maintain a relatively constant output signal envelope. Analog AGC circuits are commonly used in communications and data-storage systems. Such circuits are inexpensive and easy to manufacture. However, they normally achieve only coarse adjustment of envelope fluctuations. When finer adjustment is needed, a digital AGC circuit, in addition to or in place of an analog AGC circuit, can be used.

FIG. 2B is a block diagram of a digital AGC circuit. The analog input signal first enters an A/D converter 210. The converted digital signal then enters a digital variable-gain amplifier 212. The amplifier output enters a digital envelope or average-power detector 214, which feeds back information on the current envelope or average-power level to control the variable-gain amplifier in order to maintain a relatively constant output signal envelope. Alternatively, the A/D converter and variable-gain amplifier can be combined together, so that the feedback signal directly controls the gain and offset of the A/D converter. Both analog and digital AGC circuits use either an envelope or average-power detector, which requires that the original signal either reach the envelope extrema (both maximum and minimum envelope levels) or have constant average power, respectively, over the time scale of the feedback loop.

Binary signals in data-storage systems, whether magnetic, optical, or magneto-optic, all have run-length limit (RLL) and DC control (DCC) coding, such as eight fourteen modulation (EFM) in compact-disc (CD) data-storage drives. Consequently, the binary signals written to the disc have constant average power and, even in the presence of intersymbol interference (ISI), will reach envelope extrema frequently.

Multilevel signals, however, are not guaranteed to ever reach their extrema because the signals can stay within middle levels indefinitely. Even when extreme levels do occur, if ISI is present, the multilevel data signal must stay at that maximum or minimum level for several marks for the read signal to reach the envelope extreme.

Moreover, the average power of a multilevel signal, even with DCC, is not necessarily constant. In order for a multilevel optical read system to reliably desnake a read signal, a method for detecting envelope fluctuations is needed for a multilevel signal with the characteristics described above.

SUMMARY OF THE INVENTION

Accordingly, a method is disclosed for detecting envelope fluctuations in a multilevel optical read signal and removing such distortions in the presence of noise and defects using digital processing techniques. In one embodiment, a method is disclosed for modifying the write sequence to provide fixed patterns of marks that will guarantee that the read signal reaches both envelope extrema even in the presence of ISI, and for desnaking the read signal using a digital AGC with an envelope detector in the feedback loop. In another embodiment, a method is disclosed for modifying the write sequence to provide constant average power, and for desnaking the read signal using a digital AGC with an average-power detector in the feedback loop.

It should be appreciated that the present invention can be implemented in numerous ways, including as a process, an apparatus, a system, a device, a method, or a computer readable medium such as a computer readable storage medium or a computer network wherein program instructions are sent over optical or electronic communication links. Several inventive embodiments of the present invention are described below.

In one embodiment, a method of determining a gain control signal for a multilevel read signal includes detecting a maximum signal in an interior portion of a maximum automatic gain control mark wherein the automatic gain control mark includes a series of high level marks such that the maximum signal detected in the interior portion of the maximum automatic gain control mark is not reduced by intersymbol interference and detecting a minimum signal in an interior portion of a minimum automatic gain control mark wherein the automatic gain control mark includes a series of low level marks such that the minimum signal detected in the interior portion of the minimum automatic gain control mark is not reduced by intersymbol interference. The envelope of the signal is determined from the maximum signal and the minimum signal. A gain control signal is computed such that variance in the envelope of the signal over time is reduced.

In one embodiment, a method of encoding a multilevel signal includes periodically inserting a maximum automatic gain control mark amongst a series of data fields wherein the automatic gain control mark includes a series of high level marks such that the maximum signal detected in the interior portion of the maximum automatic gain control mark is not reduced by intersymbol interference and periodically inserting a minimum automatic gain control mark amongst a series of data fields wherein the automatic gain control mark includes a series of high level marks such that the maximum signal detected in the interior portion of the minimum automatic gain control mark is not reduced by intersymbol interference. In one embodiment, an automatic gain control circuit includes an envelope detector configured to compute a gain control signal by detecting a maximum signal in an interior portion of a maximum automatic gain control mark wherein the automatic gain control mark includes a series of high level marks such that the maximum signal detected in the interior portion of the maximum automatic gain control mark is not reduced by intersymbol interference and detecting a minimum signal in an interior portion of a minimum automatic gain control mark wherein the automatic gain control mark includes a series of low level marks such that the minimum signal detected in the interior portion of the minimum automatic gain control mark is not reduced by intersymbol interference. The envelope of a read signal is determined from the maximum signal and the minimum signal. A variable gain amplifier is controlled by the gain control signal such that the variance of the envelope of the read signal over time is reduced.

In one embodiment, a multilevel write channel includes a data source and a symbol merger configured to insert a maximum automatic gain control mark wherein the automatic gain control mark includes a series of high level marks such that the maximum signal detected in the interior portion of the maximum automatic gain control mark is not reduced by intersymbol interference and to insert a minimum automatic gain control mark wherein the automatic gain control mark includes a series of low level marks such that the minimum signal detected in the interior portion of the minimum automatic gain control mark is not reduced by intersymbol interference.

In one embodiment, a multilevel medium includes data fields containing data; maximum automatic gain control marks wherein the automatic gain control mark includes a series of high level marks such that the maximum signal detected in the interior portion of the maximum automatic gain control mark is not reduced by intersymbol interference; and minimum automatic gain control marks wherein the automatic gain control mark includes a series of low level marks such that the minimum signal detected in the interior portion of the minimum automatic gain control mark is not reduced by intersymbol interference. The minimum automatic gain control marks and the maximum automatic gain control marks are periodically inserted between the data fields.

In one embodiment, a method of encoding a multilevel signal to facilitate automatic gain control includes determining the effect of a plurality of candidate merge symbols on the residual running total power associated with a current data block and selecting a preferred merge symbol based on a residual running total power minimization criteria. The preferred merge symbol is added to the current data block.

In one embodiment, a multilevel write channel includes a data source providing a series of data blocks and a symbol merger configured to insert a merge symbol into each data block wherein the merge symbol is selected by determining the effect of a plurality of candidate merge symbols on the residual running total power associated with the data block and applying a residual running total power minimization criteria.

In one embodiment, a multilevel medium includes a plurality of data blocks that include a merge symbol wherein the merge symbol is selected by determining the effect of a plurality of candidate merge symbols on the residual running total power associated with each data block and applying a residual running total power minimization criteria.

These and other features and advantages of the present invention will be presented in more detail in the following detailed description and the accompanying figures which illustrate by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which:

FIG. 1 is a block diagram illustrating the system disclosed in Kobayashi for recovering such data.

FIG. 2A is a block diagram of a typical analog AGC circuit for removing envelope fluctuations.

FIG. 2B is a block diagram of a digital AGC circuit.

FIG. 3 is a block diagram illustrating a discrete-time equivalent system of an optical data storage system.

FIG. 4A is a diagram illustrating how AGC fields 402 are inserted among data fields in one embodiment.

FIG. 4B is a diagram illustrating two AGC field patterns that are DC-balanced.

FIG. 5 is a flow chart illustrating the process of desnaking.

FIG. 6A is a block diagram illustrating a differentially encoded system that maintains constant average power.

FIG. 6B is a diagram illustrating the data format produced by the CAP encoder and written to the channel.

FIG. 7A is a block diagram of a differential multilevel (DML) encoder.

FIG. 7B is a block diagram of a partial-response class 1 (PR1) precoder.

FIG. 8A is a flow chart illustrating a process for selecting and inserting a merge symbol during CAP encoding.

FIG. 8B shows an example input block and output candidate blocks for the DML encoder, as well as the corresponding criteria for selecting the merge symbol.

FIG. 9A is a flow chart illustrating the cleanup procedure.

FIG. 9B is a diagram illustrating the data format for a sector that includes a sector cleanup field.

DETAILED DESCRIPTION

A detailed description of a preferred embodiment of the invention is provided below. While the invention is described in conjunction with that preferred embodiment, it should be understood that the invention is not limited to any one embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention. The present invention may be practiced according to the claims without some or all of these specific details. For the purpose of clarity, technical material that is known in the technical fields related to the invention has not been described in detail in order not to unnecessarily obscure the present invention.

In one embodiment, the write sequence is modified to provide fixed patterns of marks that guarantee that the read signal reaches both envelope extrema even in the presence of ISI. The read signal is desnaked using a digital AGC with an envelope detector in the feedback loop.

For example, consider an optical write-read system that has a discrete-time equivalent channel response with a length of 2n+1 symbols (that is, a given symbol written to the disc will cause ISI in the preceding n symbols and following n symbols read from the disc). If a pattern consisting of 2n+1 symbols at the lowest, or highest, level is written, then when reading the optical signal, the middle symbol of the pattern will reach the lowest, or highest, possible level (in other words, the respective envelope extreme).

FIG. 3 is a block diagram illustrating a discrete-time equivalent system of an optical data storage system. Channel 300 represents the combined process of writing, reading, and A/D conversion. For the purpose of illustration, the channel includes only ISI, as represented in the channel response, and does not include noise, defects, or snaking. The channel response is $h_k$, k=-n . . . +n, with normalization $\Sigma h_k=1$. $a_k$ is the symbol sequence written to the disk, with levels ranging from 0 to M−1, and $b_k=a_k*h_k$ is the sampled read signal, where * is the convolution operator.

The envelope extrema, i.e., lowest and highest values that $b_k$ can achieve, are 0 and M−1, respectively. If $a_0=0$, but one or more other symbols $a_n \ldots a_{+n}>0$, then the read sample $b_0=\Sigma_j a_{k-j}>0$. The ISI causes the read sample $b_0$ to be greater than the original symbol $a_0$, so the read signal does not reach the envelope minimum of 0. If $a_n \ldots a_{+n}$ are all 0, then a pattern of 2n+1 symbols is written at the lowest level and $b_0=\Sigma(h_j a_{k-j})=0$. The middle symbol in the pattern reaches the envelope minimum.

Similarly, a pattern of 2n+1 symbols with level M−1, causes a read sample in the middle of the pattern to reach the envelope maximum. If a longer pattern is written, then more of the middle samples will be free of ISI. Periodically inserting AGC fields containing these minimum and maximum patterns into the data stream written to the disc provides one or more ISI-free samples in the middle of each field where the current level of the envelope extrema can be measured. FIG. 4A is a diagram illustrating how AGC fields 402 are inserted among data fields 404 in one embodiment.

FIG. 4B is a diagram illustrating two AGC field patterns that are DC-balanced. DC-balancing is an important criteria for signals written to and read from an optical disc. Pattern 412 begins with enough repeated low marks to ensure a minimum signal followed by the same number of repeated high marks to ensure a maximum signal. The combined signals average out to eliminate any DC offset. Similarly, Pattern 414 begins with enough repeated high marks to ensure a maximum signal followed by the same number of repeated low marks.

Of course, a real signal will also have distortions due to noise, so it is important to average minimum and maximum samples over several AGC fields to reduce the effect of noise. Thus, the frequency of AGC fields must be high enough compared to the slew rate of the envelope snaking so that a sufficient number of samples can be averaged to reduce the noise before the envelope level has changed significantly.

FIG. 5 is a flow chart illustrating the process of desnaking. In step 500, the ISI-free middle samples of the minimum and maximum AGC fields are recovered. Then, in step 502 a sliding-window average of the minimum samples is computed to obtain an average minimum. Step 504 computes a sliding-window average of the maximum samples to obtain an average maximum. Next, in step 506, the average envelope range is computed as the average maximum minus the average minimum. Finally, in step 508, the average minimum is subtracted from the data samples and the result is divided by the average envelope range to obtain normalized, desnaked data samples.

In another embodiment, the write sequence is modified to provide constant average power (CAP), and the read signal is desnaked using a digital AGC with an average-power detector in the feedback loop. The process of providing constant average power in the write sequence is suitable for systems employing differential encoding of the symbol sequence. It is related to the process of providing DC control (DCC), as described in U.S. patent application Ser. No. 09/496,897, entitled: DC CONTROL OF A MULTILEVEL SIGNAL" which is herein incorporated by reference.

FIG. 6A is a block diagram illustrating a differentially encoded system that maintains constant average power (CAP). The data source 600 provides a stream $a_k$ 602 of multilevel symbols from the alphabet {0, . . . , M−1} comprising a sector of user data to be written to the disc. This data stream may be encoded, for example, by a trellis encoder as described in U.S. patent application Ser. No. 09/369,746, filed Aug. 6, 1999, entitled "CODING SYSTEM AND METHOD FOR PARTIAL RESPONSE CHANNELS" which is herein incorporated by reference. The symbol merger 604 is a multiplexer that divides the input sector into blocks of length N symbols and inserts a merge symbol 606 in front of each block. The differential encoder 608 differentially encodes the resulting merged stream to produce a stream $b_k$ 610 of multilevel symbols that are written directly to the disk.

The CAP encoder 612, which is shown encompassing the symbol merger and differential encoder, selects the best merge symbol for maintaining constant average power. The channel 614 represents the combination of writing to and reading from the disk, as well as accompanying analog and digital signal processing necessary to equalize the combined response to the target response appropriate for the type of differential encoding used. Finally, the differential decoder 616 takes the channel signal $c_k$ 618 and outputs a decoded signal $d_k$ 620, which, in the absence of noise or other errors, is identical to the original signal $a_k$. Since the merge symbols do not contain any information, there is no CAP decoder, per se, on the read side. As with a DCC system, the read side simply ignores the merge symbols.

FIG. 6B is a diagram illustrating the data format produced by the CAP encoder and written to the channel. The data fields include blocks of N data symbols. The CAP Fields include merge symbols. The merge symbols represent overhead associated with maintaining constant average power. The data block size N determines this overhead, which is proportional to 1/(N+1), assuming that there is one merge symbol in each CAP field. As N increases, there is less overhead. However, as N increases, there is less control over the average power of the symbol stream $b_k$ sent to the channel.

FIG. 7A is a block diagram of a differential multilevel (DML) encoder. A summer 702 adds the input symbol $a_k$ 700 and a feedback signal $a_{k-1}$ 710. The modulus-M 704 restricts the summer output to lie between 0 and M−1, producing the output symbol $b_k$ 706 to be written to the disc. Delay block 708 feeds back this output symbol delayed by one time unit. In the example shown, the system uses a channel equalized to unity, i.e., a zero-forcing channel, and a differential multilevel decoder.

FIG. 7B is a block diagram of a partial-response class 1 (PR1) precoder. A summer 712 adds the input symbol $a_k$ 711 and the negative of a feedback signal $b_{k-1}$ 720. The modulus-M 714 restricts the summer output to lie between 0 and M−1, producing the output symbol $b_k$ 716 to be written to the disc. Delay block 718 feeds back this output symbol delayed by one time unit. The channel is equalized to 1+D, i.e., it is a PR1 channel. The differential encoder is the same as the one illustrated in FIG. 7A except for the sign of the delayed feedback signal. Other embodiments use other differential encoders with appropriate target channel responses and differential decoders.

The output $b_k$ of the DML encoder is given by: $b_k = a_k + b_{k-1} \pmod{M}$. The DML encoder uses a zero-forcing channel, so the channel output ck is given by: $c_k = b_k$. The DML decoder output $d_k$, assuming no noise or errors, is given by: $d_k = c_k - c_{k-1} \pmod{M} = b_k - b_{k-1} \pmod{M} = a_k$. The output $b_k$ of the PR1 precoder is given by: $b_k = c_{k-1} \pmod{M}$. The PR1 channel output $c_k$ is given by: $c_k = b_k + b_{k-1}$. The modulus-M decoder output $d_k$, assuming no noise or errors, is given by: $d_k = c_k \pmod{M} = b_k + b_{k-1} \pmod{M} = a_k$.

FIG. 8A is a flow chart illustrating a process for selecting and inserting a merge symbol during CAP encoding. The digital value (DV) of an M-ary symbol x=0 . . . M−1 is defined by: $DV(x) = 2*x - (M-1)$. The digital sum square (DSS) of a block B of M-ary symbols is then defined by: $DSS(B) = \Sigma [DV(b_i)]^2$, where $b_i$, i=1 . . . N, are the N symbols in block B. The running total power (RTP) of a sequence at time k is the digital sum square from the first symbol of the sequence up to the $k^{th}$ symbol. The running average power (RAP) at time k is RTP/k. In general, if the RAP varies significantly, then the sequence will not have constant average power. Likewise, if the RAP is always close to some constant value, then the sequence will have relatively constant average power. Consequently, the goal of the CAP encoder is to maintain the RAP close to a target RAP throughout the sequence using some criteria.

The residual running total power (RRTP) at time k is the RTP minus the target RAP times k, RRTP=RTP−k*target RAP. Given a new block of user data, the CAP encoder first must know the current RRTP, i.e., the RRTP at the end of the previous block. The initial RRTP is set to zero. The CAP encoder can insert one of up to M different merge symbols (perhaps because of RLL or other constraints, some of the merge symbols may not be allowed). For each candidate merge symbol, it determines the effect on the RRTP of the new block after differential encoding. It then chooses the candidate merge symbol whose corresponding RRTP among all candidates, satisfies some minimization criteria. Finally, the merge symbol and the block of user data passes through the differential encoder.

A simple but effective minimization criteria is the absolute value of the RRTP at the end of the block. Another simple minimization criteria is the largest absolute value of the RRTP occurring in the block. Both criteria associate a single number to each candidate merge symbol, which makes the comparison and selection easy. In other embodiments, more complex criteria are used. The target RAP should be selected somewhere in the middle of the expected range of the RAP. For example, if each symbol occurs equally often, then the expected RAP is given by: $E[RAP] = \Sigma$ over x=0 . . . M−1 of $([DV(x)]^2)/M = \Sigma$ over x=0 . . . M−1 of $([2*x-(M-1)]^2)/M = (M^2-1)/3$.

FIG. 8B shows an example input block and output candidate blocks for the DML encoder, as well as the corresponding criteria for selecting the merge symbol. In this example, M=4 levels, the input block is {0 1 3 2}, the previous output level is 0, the current RRTP is −2, and the digital values of symbols {0 1 2 3} are {−3 −1 +1 +3}, respectively. The candidate merge symbols {0 1 2 3} result in ending absolute RRTP values {6 14 6 10} and maximum absolute RRTP values {6 18 10 14}, respectively. Candidate merge symbol 0 is clearly the best. Using the ending absolute RRTP criteria, either merge symbol 0 or 2 would be acceptable. Using the maximum absolute RRTP criteria, only merge symbol 0 would be acceptable.

In various embodiments, the ending absolute RRTP or maximum absolute RRTP criteria may be used separately or mixed. For example, one criteria may be initially applied and the other used to break any ties. Alternatively, the average or weighted average of the two criteria may be applied. One criteria may be used exclusively with the other ignored altogether.

In the event of a tie, the CAP encoder can choose the lowest symbol. Other methods of breaking ties may also be adopted, such as randomly selecting one of the candidate symbols. The process of selecting CAP merge symbols can be expanded to consider several blocks and merge symbols at the same time. The minimization criteria can be a weighted combination of absolute RRTP values at the end of each block, or of maximum absolute RRTP values that occur in each block. While this is more complicated, it may result in slightly better control of the average power and DC content of the output symbol stream.

The process of CAP encoding is similar to DCC encoding as described in "DC CONTROL OF A MULTILEVEL SIGNAL" which was previously incorporated by reference. The minimization criteria is the running digital sum (RDS) for the DCC encoder rather than the RRTP for the CAP encoder. If both DCC and CAP encoding are implemented, then the DCC and CAP encoders can be merged, and a combined RDS and RRTP minimization criteria may be used. This may be either a linear or nonlinear combination. In one embodiment, a linear weighted sum of the absolute values of RDS and RRTP, either maximum or ending, is used as a simple solution.

Maintaining constant average power does not guarantee that the RRTP at the end of the sector will be zero. This residual RRTP, while small in absolute value, could build up over multiple sectors and degrade the desnaker performance. Therefore, a field is included at the end of each sector to zero out the residual RRTP. This cleanup field can be small since the residual RRTP is small, so its inclusion does not cause much overhead even for relatively small sectors.

FIG. 9A is a flow chart illustrating the cleanup procedure. The user data is CAP encoded for the sector in step 900. The residual error is computed in step 902. In step 904, marks are written to zero out the residual RRTP.

FIG. 9B is a diagram illustrating the data format for a sector that includes a sector cleanup field. A series of CAP fields 910 are inserted among a series of Data fields 912. At the end, a sector cleanup field 914 is used to zero out the residual RRTP.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A method of determining a gain control signal for a multilevel read signal comprising:
   detecting a maximum signal in an interior portion of a maximum automatic gain control mark wherein the automatic gain control mark includes a series of high level marks such that the maximum signal detected in the interior portion of the maximum automatic gain control mark is not reduced by intersymbol interference;
   detecting a minimum signal in an interior portion of a minimum automatic gain control mark wherein the automatic gain control mark includes a series of low level marks such that the minimum signal detected in the interior portion of the minimum automatic gain control mark is not reduced by intersymbol interference;
   determining the envelope of the signal from the maximum signal and the minimum signal; and
   computing a gain control signal such that variance in the envelope of the signal over time is reduced.

2. A method of determining a gain control signal for a multilevel read signal as recited in claim 1 wherein the gain control signal controls a digital gain amplifier.

3. A method of determining a gain control signal for a multilevel read signal as recited in claim 1 wherein the gain control signal controls an analog variable gain amplifier.

4. A method of determining a gain control signal for a multilevel read signal as recited in claim 1 wherein the maximum automatic gain control mark and the minimum automatic gain control mark are combined so that the DC value of the combined mark is zero.

5. A method of determining a gain control signal for a multilevel read signal as recited in claim 1 wherein an average maximum is determined over a plurality of maximum signals and an average minimum is determined over a plurality of minimum signals and wherein the envelope of the signal is determined using the average maximum and the average minimum.

6. A method of determining a gain control signal for a multilevel read signal as recited in claim 5 wherein the average maximum is determined using a sliding window.

7. A method of determining a gain control signal for a multilevel read signal as recited in claim 5 wherein the average minimum is determined using a sliding window.

8. A method of determining a gain control signal for a multilevel read signal as recited in claim 1 wherein the multilevel read signal is read from an optical disc.

9. A method of encoding a multilevel signal comprising:
   periodically inserting a maximum automatic gain control mark amongst a series of data fields wherein the automatic gain control mark includes a series of high level marks such that the maximum signal detected in the interior portion of the maximum automatic gain control mark is not reduced by intersymbol interference; and
   periodically inserting a minimum automatic gain control mark amongst a series of data fields wherein the automatic gain control mark includes a series of high level marks such that the maximum signal detected in the interior portion of the minimum automatic gain control mark is not reduced by intersymbol interference.

10. An automatic gain control circuit comprising:
   an envelope detector configured to compute a gain control signal by:
      detecting a maximum signal in an interior portion of a maximum automatic gain control mark wherein the automatic gain control mark includes a series of high level marks such that the maximum signal detected in the interior portion of the maximum automatic gain control mark is not reduced by intersymbol interference;
      detecting a minimum signal in an interior portion of a minimum automatic gain control mark wherein the automatic gain control mark includes a series of low level marks such that the minimum signal detected in the interior portion of the minimum automatic gain control mark is not reduced by intersymbol interference; and
      determining the envelope of a read signal from the maximum signal and the minimum signal; and
   a variable gain amplifier controlled by the gain control signal such that the variance of the envelope of the read signal over time is reduced.

11. A multilevel write channel comprising:

a data source; and a symbol merger configured to insert a maximum automatic gain control mark wherein the automatic gain control mark includes a series of high level marks such that the maximum signal detected in the interior portion of the maximum automatic gain control mark is not reduced by intersymbol interference and to insert a minimum automatic gain control mark wherein the automatic gain control mark includes a series of low level marks such that the minimum signal detected in the interior portion of the minimum automatic gain control mark is not reduced by intersymbol interference.

12. A multilevel medium comprising:

data fields containing data;

maximum automatic gain control marks wherein the automatic gain control mark includes a series of high level marks such that the maximum signal detected in the interior portion of the maximum automatic gain control mark is not reduced by intersymbol interference; and minimum automatic gain control marks wherein the automatic gain control mark includes a series of low level marks such that the minimum signal detected in the interior portion of the minimum automatic gain control mark is not reduced by intersymbol interference;

wherein the minimum automatic gain control marks and the maximum automatic gain control marks are periodically inserted between the data fields.

* * * * *